(12) United States Patent
Kimura et al.

(10) Patent No.: US 11,762,594 B2
(45) Date of Patent: Sep. 19, 2023

(54) MEMORY SYSTEM AND METHOD OF CONTROLLING THEREOF

(71) Applicant: Kioxia Corporation, Tokyo (JP)

(72) Inventors: Naoki Kimura, Ebina Kanagawa (JP); Junya Kishikawa, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/469,486

(22) Filed: Sep. 8, 2021

(65) Prior Publication Data
US 2022/0291868 A1 Sep. 15, 2022

(30) Foreign Application Priority Data
Mar. 10, 2021 (JP) ................... 2021-038560

(51) Int. Cl.
*G06F 13/16* (2006.01)
*G06F 13/42* (2006.01)
*G06F 3/06* (2006.01)
*G06F 1/10* (2006.01)
*G06F 13/40* (2006.01)
*G11C 5/14* (2006.01)

(52) U.S. Cl.
CPC ............ *G06F 3/0659* (2013.01); *G06F 1/10* (2013.01); *G06F 3/0604* (2013.01); *G06F 3/0679* (2013.01); *G06F 13/1668* (2013.01); *G06F 13/4022* (2013.01); *G06F 13/4282* (2013.01); *G06F 2213/0026* (2013.01); *G06F 2213/0034* (2013.01); *G11C 5/14* (2013.01)

(58) Field of Classification Search
CPC .................. G06F 13/1668; G06F 13/4282
See application file for complete search history.

(56) References Cited

U.S. PATENT DOCUMENTS

| | | | |
|---|---|---|---|
| 10,551,897 B2 | 2/2020 | Loewen et al. | |
| 10,719,435 B2 | 7/2020 | Lim et al. | |
| 10,795,772 B2 | 10/2020 | Nakatsuka et al. | |
| 2020/0312395 A1 | 10/2020 | Takizawa | |
| 2021/0294504 A1* | 9/2021 | Shirakura | G06F 3/0625 |
| 2022/0291868 A1* | 9/2022 | Kimura | G06F 13/4282 |

FOREIGN PATENT DOCUMENTS

| | | |
|---|---|---|
| JP | 2017-097787 A | 6/2017 |
| TW | 202036276 A | 10/2020 |

* cited by examiner

*Primary Examiner* — David E Martinez
(74) *Attorney, Agent, or Firm* — Foley & Lardner LLP

(57) ABSTRACT

A memory system of an embodiment is connectable to a host and includes a nonvolatile memory and a memory controller. The memory controller includes: a signal line which transfers a signal sent from the host; a resistance element disposed between and electrically connected to the signal line and a wiring line given a reference potential of the memory system; a switching element connected serially to the resistance element and capable of switching a connection between the signal line and the wiring line; and a control circuit which controls the switching element to switch the connection between the signal line and the wiring line from a connected state to a disconnected state, when a change from a first potential to a second potential occurs on the signal line or when a change from the second potential to the first potential occurs on the signal line.

20 Claims, 5 Drawing Sheets

MEMORY SYSTEM AND METHOD OF CONTROLLING THEREOF

CROSS REFERENCE TO RELATED APPLICATIONS

This application is based upon and claims the benefit of priority from Japanese Patent Application No. 2021-038560, filed on Mar. 10, 2021; the entire contents of which are incorporated herein by reference.

FIELD

Embodiments described herein relate to a memory system and a control method.

BACKGROUND

A memory system connectable to a host device communicates with the host device through signal lines conforming to certain interface standards. Such signal lines may include optional signal lines for low-speed communication besides signal lines for high-speed communication. The optional signal lines include, for example, signal lines for transferring a clock signal, a data signal, and so on. Some host device is not provided with a circuit that processes on signals transferred through the optional signal lines. In a memory system connected to such a host device, a circuit in the memory system that processes on signals transferred through the optional signal lines is not connected to the host device, and thus an input/output port of the circuit is open.

Even if the input/output port is open, it is not desirable for the potential of the signal lines to be indeterminate. A certain interface standard also prescribes that an input/output port of a circuit that is provided in a host device to process on signals transferred through optional signal lines be pulled up (connected to a positive power supply line through resistors or the like). That is, when the host device provided with the circuit including the input/output port that is pulled up is connected to the memory system, the state of the potential of a circuit, in the memory system, connected to the aforesaid circuit is protected. A memory system connected to a host device not provided with such a circuit also requires some protecting means. Therefore, in the memory system, an optional signal line may be connected to a reference potential of a power supply line, a ground line or the like through resisters or the like.

DETAILED DESCRIPTION

It is an object of an embodiment to provide a memory system that is connectable to a host device, wherein a signal line is protectable even when an output/input port of the memory system is open, and to provide a control method thereof.

A memory system of an embodiment is connectable to a host and the memory system includes a nonvolatile memory and a memory controller. The memory controller is capable of executing a command received from the host and addressed to the memory. The memory controller includes: a signal line which transfers a signal sent from the host; a resistance element disposed between and electrically connected to the signal line and a wiring line given a reference potential of the memory system; a switching element connected serially to the resistance element and capable of switching a connection between the signal line and the wiring line; and a control circuit which controls the switching element to switch the connection between the signal line and the wiring line from a connected state to a disconnected state, when a change from a first potential corresponding to a logical value H level to a second potential corresponding to a logical value L level occurs on the signal line or when a change from the second potential to the first potential occurs on the signal line.

Configuration of First Embodiment

Figure 1:
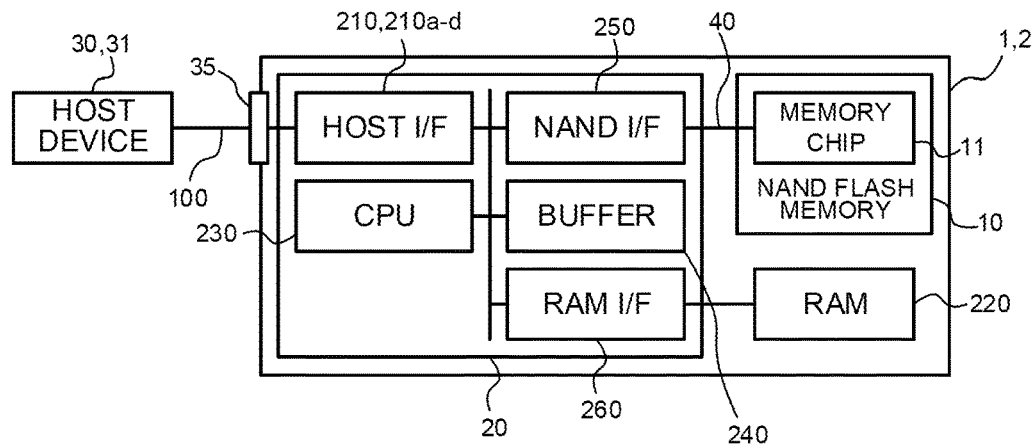
FIG. 1 is a block diagram illustrating a configuration of a memory system according to an embodiment connected to a host device.

FIG. 1 is a diagram illustrating an example of a configuration of a memory system 1 of an embodiment. As illustrated in FIG. 1, the memory system 1 is connectable to a host device 30 through a bus 100 conforming to a certain interface standard. The host device 30 is, for example, a server, a personal computer, or a mobile information processing device. The memory system 1 functions as an external storage of the host device 30. The host device 30 is capable of issuing requests to the memory system 1. The requests include a read request and a write request.

The memory system 1 includes a NAND flash memory 10, a controller (an example of the memory controller) 20, and a RAM (Random Access Memory) 220. The NAND flash memory 10 includes one memory chip 11 or more. The memory chip 11 includes a plurality of memory cell transistors and is capable of nonvolatile data storage. The memory chip 11 is connected to the controller 20 through a NAND bus 40.

The controller 20 includes a host interface (HOST I/F) 210, a CPU (Central Processing Unit) 230, a buffer memory (BUFFER) 240, a NAND interface (NAND I/F) 250, and a RAM interface (RAM I/F) 260. These parts are connected to one another through an internal bus to be mutually communicable.

The controller 20 performs program processing, read processing, erase processing, and so on to the NAND flash memory 10. The controller 20 is a semiconductor circuit configured as SoC (System-On-a-Chip), for instance. The controller 20 may be configured as FPGA (Field-Programmable Gate Array) or ASIC (Application Specific Integrated Circuit). The controller 20 may be formed of a plurality of chips. Functions of the controller 20 can be implemented by the CPU 230 which executes software (firmware), specialized hardware, or a combination of these.

The host interface 210 is connected to the host device 30 through the bus 100 conforming to interface standards, for example, the SATA (Serial Advanced Technology Attachment) standard, the SAS (Serial Attached SCSI) (registered trademark) standard, the PCI (Peripheral Components Interconnect)•Express (registered trademark) (PCIe) standard, or the SMBus (System Management Bus) (registered trademark) standard and executes the communication between the controller 20 and the host device 30.

The memory system 1 has an input/output port 35 used for the connection to the host device 30. The input/output port 35 has a relaying function between the host device 30 and the host interface 210 and is an example of, for example, a connector portion. The input/output port 35 may conform to two or more interface standards for high-speed communication (such as PCIe, SATA, and the like) and for low-speed communication (such as SMBus). The input/output port 35 supports one standard or more out of the interface standards that the bus 100 supports.

The NAND interface 250 is connected to the memory chip 11 of the NAND flash memory 10 through the NAND bus 40 and executes the communication between the controller 20 and the memory chip 11. The RAM interface 260 is connected to the RAM 220 and executes the communication between the controller 20 and the RAM 220.

The CPU 230 controls the operation of the controller 20.

The RAM 220 provides a work area to the CPU 230 through the RAM interface 260. The buffer memory 240 temporarily stores data that is to be transmitted to the memory chip 11 of the NAND flash memory 10 and data received from the memory chip 11. The RAM 220 and the buffer memory 240 each can be implemented by, for example, DRAM (Dynamic Random Access Memory), SRAM (Static Random Access Memory), or a combination of these. It should be noted that the kind of memories constituting the RAM 220 and the buffer memory 240 is not limited to these. The buffer memory 240 may be mounted outside the controller 20.

(Interface Standard to which Host Interface Conforms)

An interface standard for the connection of the host device 30 and the memory system 1 prescribes various specifications from the viewpoint of hardware and software. An interface standard for the connection between a main device such as the host device 30 and a sub-device such as the memory system 1 prescribes signal lines for low-speed communication such as a data signal line that transfers data and a clock signal line that transfers a clock signal, besides signal lines of PCIe or the like for high-speed communication.

It is necessary to pull up or pull down a data signal line and a clock signal line in the host device 30 or the memory system 1 when a terminal (input/output port) connected to these signal lines is in non-connection (is open), to stabilize an operation of the device and protect the device from an excessive external input and so on. To pull up means to connect a target data signal line or clock signal line to a wiring line in which a positive reference potential is given (hereinafter referred as a positive power supply line), via a resistance element having certain resistance value. The positive reference potential is a potential of a power supply of the host device 30, the memory system 1 or a circuit provided therein. To pull down means to connect a target data signal line or clock signal line to a ground line or a wiring line in which a negative reference potential is given (hereinafter referred as a negative power supply line), via a resistance element having certain resistance value. A potential of the ground line is a reference potential of the host device 30, the memory system 1 or a circuit provided therein. In the following description, to pull up means to connect to a positive power supply line through a resistor, and to pull down means to connect to a ground line through a resistor. The ground line may be the same as or different from the negative power supply line. In the embodiments, the term of "potential" may corresponds to "level".

An interface standard for the connection between a main device and a sub-device usually prescribes that a data signal line or a clock signal line be pulled up or pulled down in the main device side. However, only this cannot protect a circuit of the sub-device that connected to the data signal line and the clock signal line.

It is also a practice in recent years that one input/output port conforms to a plurality of interface standards. In this case, all the host devices do not always support all the interface standards that the input/output port supports. This may cause a situation in which a circuit of the sub-device that connected to the data signal line and the clock signal line is partly not protected.

In the memory system 1 of the embodiment, a characteristic configuration of the host interface 210 protects the memory system 1. Hereinafter, part of a configuration of the host interface 210 in the memory system 1 of the first embodiment will be described in detail with reference to FIG. 2.

The host interface 210 of the embodiment conforms to the PCIe standard which is an example of a high-speed communication interface standard and the SMBus standard which is an example of a low-speed communication interface standard. The SMBus standard is a serial bus standard derived from the I²C™ standard. Transmission lines used in the SMBus standard are an SCL line which transfers a clock signal and an SDA line which transfers a data signal. The host interface 210 of this embodiment includes a host interface 210a conforming to the SMBus standard for low-speed communication and a host interface 210b conforming to the PCIe standard for high-speed communication.

Figure 2:
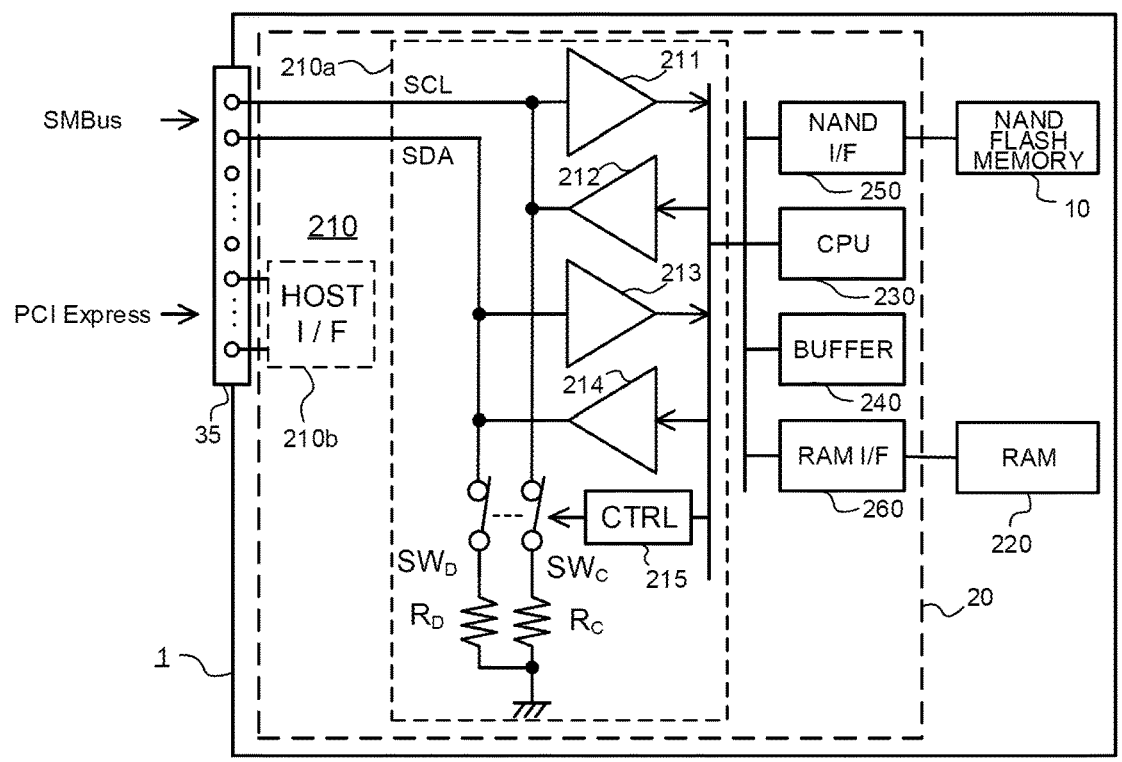
FIG. 2 is a block diagram illustrating part of a configuration of a host interface in a memory system according to a first embodiment.

As illustrated in FIG. 2, in the memory system 1, the input/output port 35 and the host interface 210a are connected through the SCL line and the SDA line conforming to the SMBus standard. Further, the input/output port 35 and the host interface 210b are connected through a plurality of signal lines conforming to the PCIe standard. In the example illustrated in FIG. 2, the input/output port 35 supports the PCIe standard for high-speed communication and the SMBus standard for low-speed communication, but this is not restrictive. For example, the input/output port 35 may further support the USB standard or the like.

The host interface 210a has an input buffer 211 which receives a clock signal from the SCL line and an input buffer 213 which receives a data signal from the SDA line. The input buffer 211 sends the received clock signal to another functional element of the controller 20. The input buffer 213 sends the received data signal to another functional element of the controller 20.

The host interface 210a further has an output buffer 212 which sends a clock signal received from another functional element of the controller 20, to the host device 30 through the SCL line. Similarly, the host interface 210a has an output buffer 214 which sends a data signal received from another functional element of the controller 20, to the host device 30 through the SDA line.

The host interface 210a further has a resistor $R_C$, a resistor $R_D$, a switch $SW_C$, and a switch $SW_D$. The resistor $R_C$ has one end connected to a ground line and the other end connected to the switch $SW_C$. The switch $SW_C$ is disposed between the SCL line connected to the input/output port 35 and the resistor $R_C$. The resistor $R_D$ has one end connected to the ground line and the other end connected to the switch $SW_D$. The switch $SW_D$ is disposed between the SDA line connected to the input/output port 35 and the resistor $R_D$. The ground line is a reference potential line and may be a negative power supply line. The switch $SW_C$ and the switch $SW_D$ are each constituted by, for example, an electronic switch or a transistor, and their opening/closing is controlled by a switch control circuit 215. The resistor $R_C$ and the resistor $R_D$ are one example of a resistance element. The switch $SW_C$ and the switch $SW_D$ are one example of a switching element.

The SCL line connected to the input/output port 35 is connected to an input of the input buffer 211, an output of the output buffer 212, and one end of the switch $SW_C$. The other end of the switch $SW_C$ is connected to the ground line through the resistor $R_C$. An output of the input buffer 211 and an input of the output buffer 212 are connected to other functional elements of the controller 20.

The SDA line connected to the input/output port 35 is connected to an input of the input buffer 213, an output of the output buffer 214, and one end of the switch $SW_D$. The other end of the switch $SW_D$ is connected to the ground line through the resistor $R_D$. An output of the input buffer 213 and an input of the output buffer 214 are connected to the other functional elements of the controller 20.

The switch control circuit 215 controls the opening/closing of the switch $SW_C$ and the switch $SW_D$ based on an opening/closing condition. The opening/closing condition is based on whether or not the host device 30 is connected to the memory system 1. More specifically, the switch control circuit 215 opens the switch $SW_C$ and the switch $SW_D$ if the SCL line or the SDA line is equal in potential to a power supply line of the host device 30 (or the memory system 1) in a state in which the switch $SW_C$ and the switch $SW_D$ are closed, and otherwise, the switch control circuit 215 keeps the switch $SW_C$ and the switch $SW_D$ closed. The detection of the potentials of the SCL line and the SDA line can be performed by the switch control circuit 215 monitoring the outputs of the input buffer 211 and the input buffer 213.

Specifically, first, the switch control circuit 215 closes the switch $SW_C$ and the switch $SW_D$ to pull down the SCL line and the SDA line to the ground line through the resistor $R_C$ and the resistor $R_D$, respectively. In this state, the switch control circuit 215 detects that the SCL line and the SDA line are floating without the host device 30 connected to the input/output port 35 of the memory system 1. In this case, the switch control circuit 215 keeps the switch $SW_C$ and the switch $SW_D$ closed to keep the SCL line and the SDA line pulled down to the ground line through the resistor $R_C$ and the resistor $R_D$, respectively. Here, that signal lines are "floating" means that an external part of the input/output port 35 (that is, its host device 30 side) is not electrically connected to a reference potential line having a reference potential, such as a positive power supply line, a negative power supply line, or a ground line, and unless the signal lines are pulled down in the host interface 210a, the potentials of the signal lines are not fixed (are indeterminate).

On the other hand, when the host device 30 is connected to the input/output port 35 of the memory system 1 and the SCL line or the SDA line becomes equal in potential to the positive power supply line, the switch control circuit 215 opens the switch $SW_C$ and the switch $SW_D$ to cancel the state in which the SCL line and the SDA line are pulled down in the host interface 210a.

The SCL line and the SDA line conforming to the SMBus standard are wired-OR-connectable to a plurality of devices through the bus 100. Accordingly, the pulling-down in the host interface 210a is performed through resistors having a relatively large value.

Figure 3:
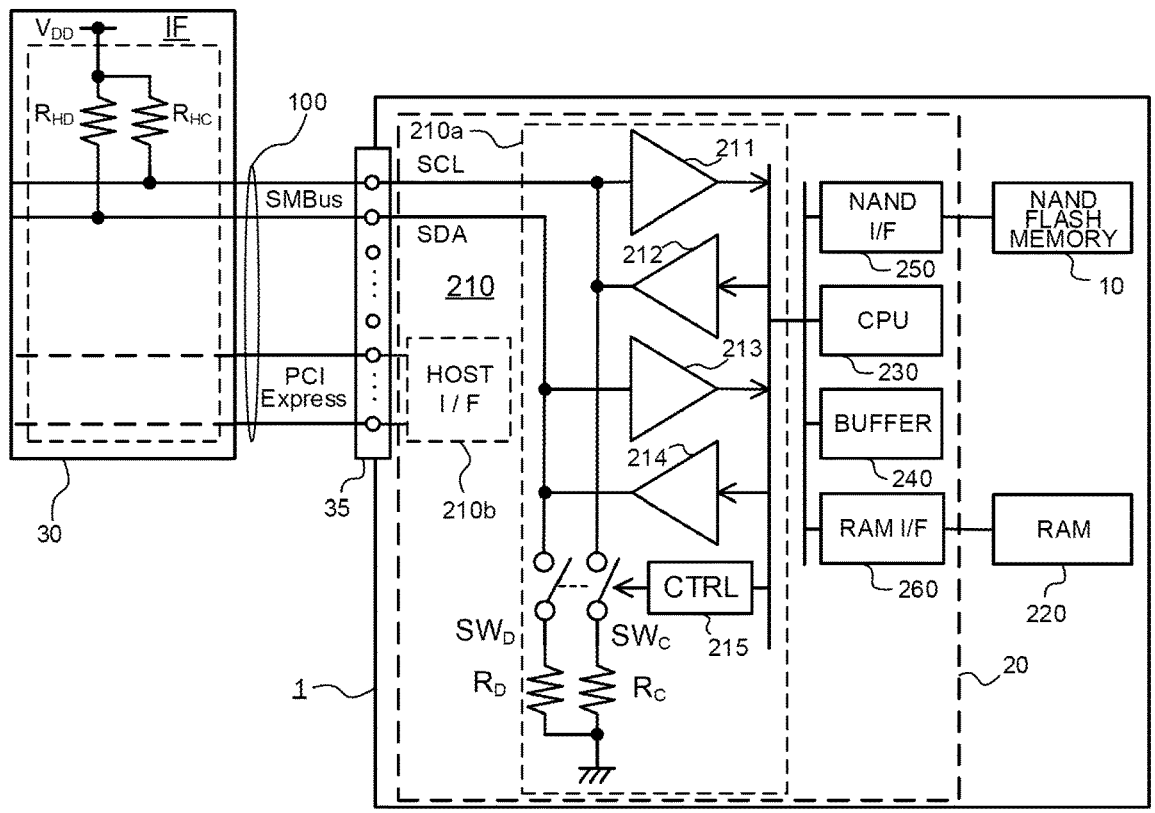
FIG. 3 is a block diagram illustrating a configuration in a state in which a host interface of the memory system according to the first embodiment is connected to a host device.

FIG. 3 illustrates a state in which the host device 30 is connected to the memory system 1 through the input/output port 35 in this embodiment. As illustrated in FIG. 3, in an interface IF of the host device 30, the SCL line and the SDA line are pulled up to a power supply line $V_{DD}$ through a resistor $R_{HC}$ and a resistor $R_{HD}$ respectively. This is because, if the SCL line being the clock signal line and the SDA line being the data signal line are floating without connected to the power supply line or the ground line, not only signals cannot be normally transferred but also elements of the host device 30 may be broken.

Usually, in the interface standard to which the host device 30 conforms, a data signal line and a clock signal line are pulled up to a power supply line, and the resistance values of resistors for pulling up are decided in advance. That is, the resistance values of the resistor $R_{HC}$ and the resistor $R_{HD}$ are prescribed values.

When detecting, on the SCL line or the SDA line, a potential equal to a power supply voltage $V_{DD}$, the switch control circuit 215 of the controller 20 opens the switch $SW_C$ and the switch $SW_D$. This disconnects the SCL line and the SDA line from the resistor $R_C$ and the resistor $R_D$, resulting in that the SCL line and the SDA line are only pulled up to the power supply line $V_{DD}$ of the host device 30.

As illustrated in FIG. 3, the SCL line and the SDA line in the host device 30 are pulled up to the power supply line $V_{DD}$ to be stable. When the host device 30 is in connection to the memory system 1, the SCL line and the SDA line having no signal are fixed to the potential of the power supply line $V_{DD}$. In the memory system 1 of the embodiment, by detecting the power supply potential (for example, 1.8 V) appearing on the SCL line or the SDA line, it is detected that the host device 30 is connected to the memory system 1. This enables the detection of whether or not the host device 30 is connected, without providing any special additional function to the interface standard.

(Significance of Switches)

Here, the significance of the switch $SW_C$ and the switch $SW_D$ in the host interface 210a will be studied. Let us consider a case where the switch $SW_C$ and the switch $SW_D$ are constantly in the connection state. In a state where the host device 30 is not connected, the SCL line and the SDA line are pulled down through the resistor $R_C$ and the resistor $R_D$ to be protected.

On the other hand, when the host device 30 is connected to the input/output port 35 as illustrated in FIG. 3, the potentials of the SCL line and the SDA line are respectively a potential resulting from the division and voltage drop by the resistor $R_{HC}$ and the resistor $R_C$ and a potential resulting from the division and voltage drop by the resistor $R_{HD}$ and the resistor $R_D$. In this case, the SCL line and the SDA line are stable in the potential level but are difficult to have desirable potential levels because the resistance values of the resistor $R_{HD}$ and the resistor $R_{HC}$ which are provided in the interface IF and the resistor $R_C$ and the resistor $R_D$ which are provided in the host interface 210a are not usually very precise. Another problem is that the resistor $R_C$ and the resistor $R_D$ in the host interface 210a may deform the waveforms of signals (cause distortion due to delayed rise or steep rise of the waveform) at the time of high-speed data transmission. Therefore, at the time of data transmission, it is desirable to disconnect the SCL line and the SDA line from the resistor $R_C$ and the resistor $R_D$ in the host interface 210a by the switch $SW_C$ and the switch $SW_D$, except the resistor $R_{HD}$ and the resistor $R_{HC}$ through which the SCL line and the SDA line are pulled up in the interface IF of the host device 30.

When the host device 30 is in connection to the memory system 1 through the input/output port 35, the potential levels of the SCL line and the SDA line are respectively a potential resulting from the division by the resistor $R_{HC}$ and the resistor $R_C$ and a potential resulting from the division by the resistor $R_{HD}$ and the resistor $R_D$ in a strict sense. Here, the resistance values of the resistor $R_C$ and the resistor $R_D$ for pulling down provided in the host interface 210a are set sufficiently larger than the resistance values of the resistor $R_{HC}$ and the resistor $R_{HD}$ for pulling up provided in the host device 30. This enables the host interface 210a to easily determine whether or not the potential levels of the SCL line and the SDA line are equal to the power supply voltage $V_{DD}$.

Figure 4:
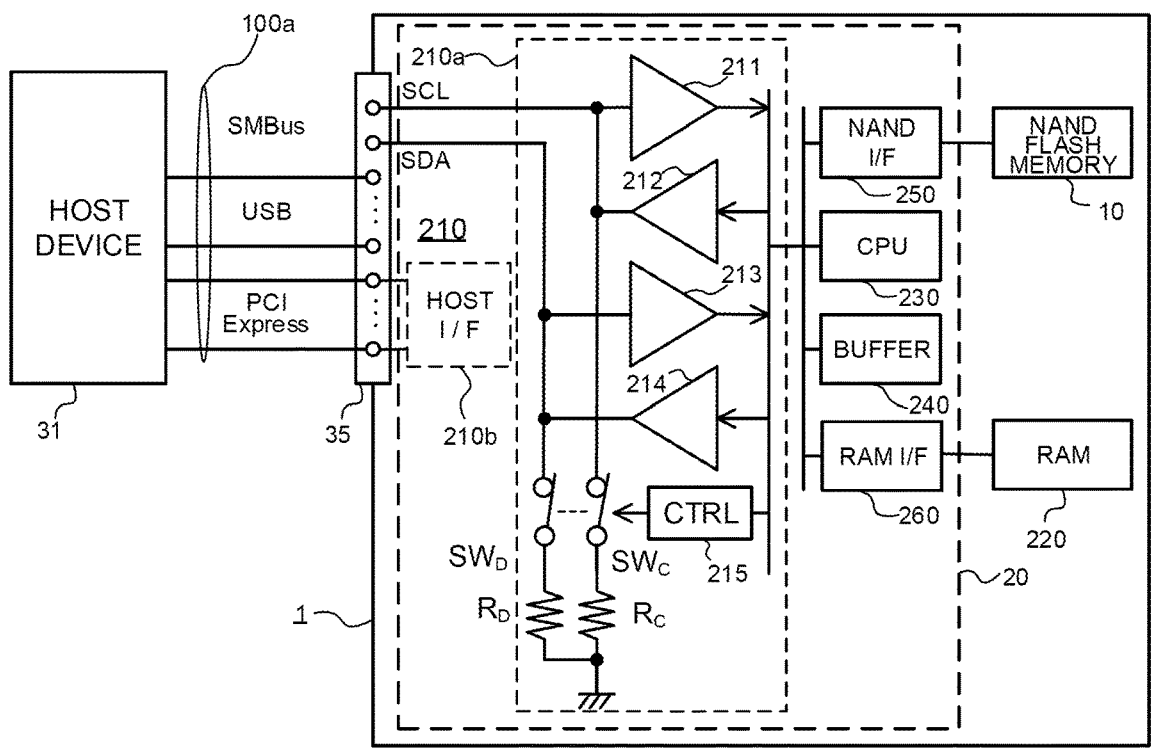
FIG. 4 is a block diagram illustrating a configuration in a state in which the host interface of the memory system according to the first embodiment is connected to another host device.

Here, an example in which the SCL line and the SDA line become floating will be described with reference to FIG. 4. Let us consider a case where the memory system 1 is connected to a host device 31 as illustrated in FIG. 4. The host device 31 does not conform to the SMBus standard for low-speed communication, and a bus 100a may not include a signal line of the SMBus standard. That is, the host device 31 supports the USB standard and the PCI•Express standard but does not support the SMBus standard. In this case, although the host device 31 is connected to the memory system 1 through the input/output port 35, the SLC line and the SDA line in the host interface 210a become floating.

The memory system 1 of the embodiment includes the switches $SW_C$ and $SW_D$ and the switch control circuit 215. This can prevent the signal lines from becoming floating even if a host device 31 side of the input/output port 35 is not connected to a terminal conforming to the SMBus standard.

Operation of First Embodiment

Figure 5:
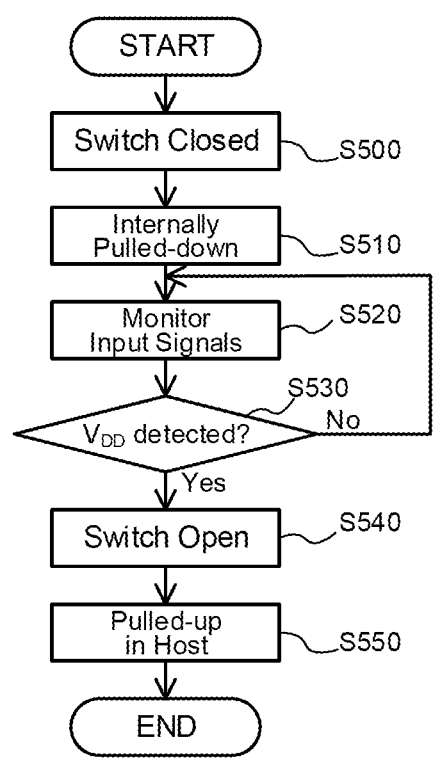
FIG. 5 is a flowchart illustrating an operation of the host interface in the memory system according to the first embodiment.

Next, the operation of the memory system 1 of this embodiment will be described with reference to FIG. 5. In an initial state in which the host device 30 is not connected to the input/output port 35, the switch control circuit 215 keeps the switch $SW_C$ and the switch $SW_D$ closed (S500). In this state, which is the state illustrated in FIG. 2, the SCL line and the SDA line of the host interface 210a are pulled down to the ground line through the resistor $R_C$ and the resistor $R_D$ in the host interface 210a (S510). This fixes both the inputs of the input buffers 211 and 213 and the outputs of the output buffers 212 and 214 to the potential of the ground line to stabilize the operation of the host interface 210a and protect the circuit.

The switch control circuit 215 monitors the potentials of input signals on the SCL line and the SDA line through the input buffers 211 and 213 (S520). If no change in the levels is detected (if the potential of the ground line is detected) on the SCL line and the SDA line, the monitoring is continued (No at S530).

When detecting, on the SCL line or the SDA line, the potential equal to that of the power supply line $V_{DD}$ (Yes at S530), the switch control circuit 215 opens the switch $SW_C$ and the switch $SW_D$ (S540). As a result, the state in which the SCL line and the SDA line are pulled down through the resistor $R_C$ and the resistor $R_D$ is canceled. That the potential of the power supply line $V_{DD}$ is detected on the SCL line or the SDA line means that the SCL line or the SDA line is pulled up to the power supply line $V_{DD}$ through the resistor $R_{HC}$ or the resistor $R_{HD}$ in the host device 30, leading to the detection that the host device 30 is connected to the input/output port 35 (S550).

The above series of operations makes the data signal line (SDA line) and the clock signal line (SCL line) which are interface lines connecting the host device 30 and the memory system 1 constantly pulled up to the power supply line $V_{DD}$ or pulled down to the ground line, to stabilize the operation of the circuit and protect the circuit.

According to the memory system 1 of the embodiment, when the host device 30 is connected thereto, the state in which the data signal line and the clock signal line are pulled down in the memory system 1 is canceled. That is, they are pulled up to the power supply line $V_{DD}$ through the resistor $R_{HC}$ and the resistor $R_{HD}$ provided in the host device 30. On the other hand, when the host device 30 is disconnected from the memory system 1, the data signal line and the clock signal line are pulled down in the memory system 1. This operation stabilizes the input/output elements of the host interface 210a to protect them from breakage.

Configuration of Second Embodiment

Next, a memory system of a second embodiment will be described with reference to FIG. 6 and FIG. 7. The memory system 1 according to the first embodiment illustrated in FIG. 2 and FIG. 3 includes the switches and the resistors through which the SCL line and the SDA line are pulled down, but the memory system 2 according to the second embodiment illustrated in FIG. 6 and FIG. 7 includes switches and resistors through which an SCL line and an SDA line are pulled up. In the following description, the same functional elements as those of the first embodiment will be denoted by the same reference signs, and a redundant description thereof will be omitted.

Figure 6:
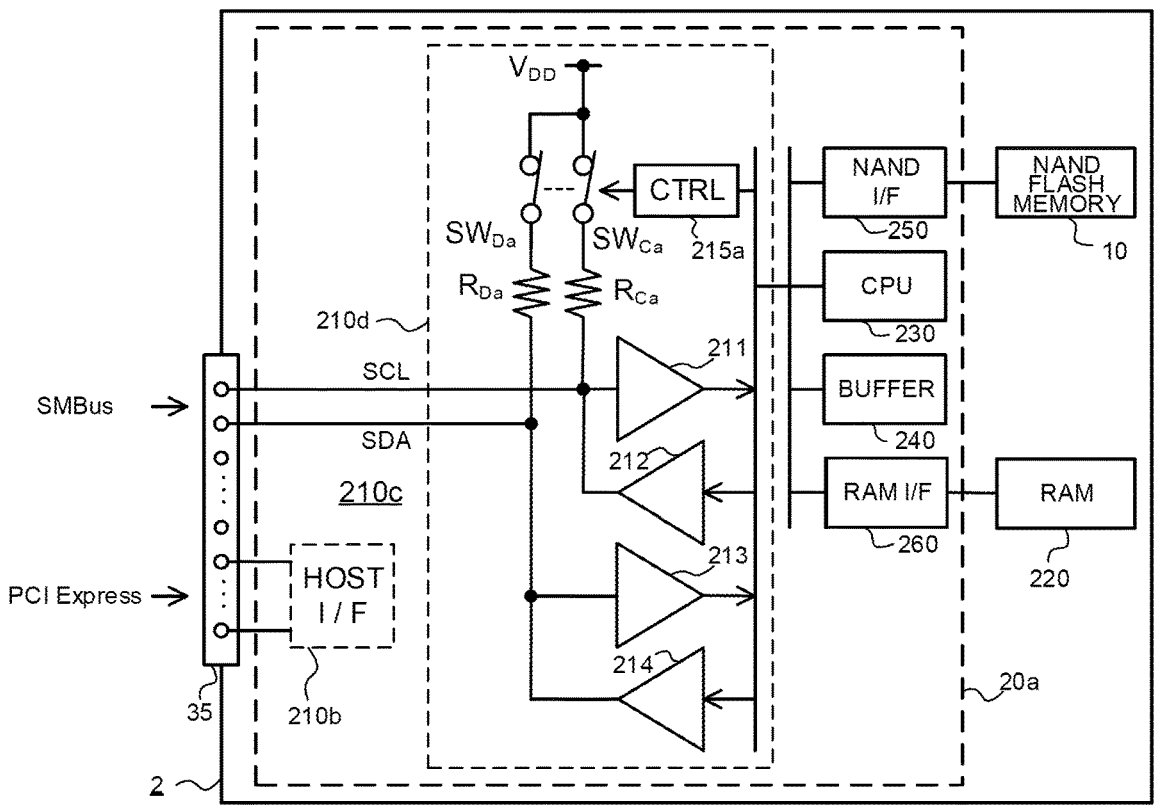
FIG. 6 is a block diagram illustrating part of a configuration of a host interface in a memory system according to a second embodiment.
Figure 7:
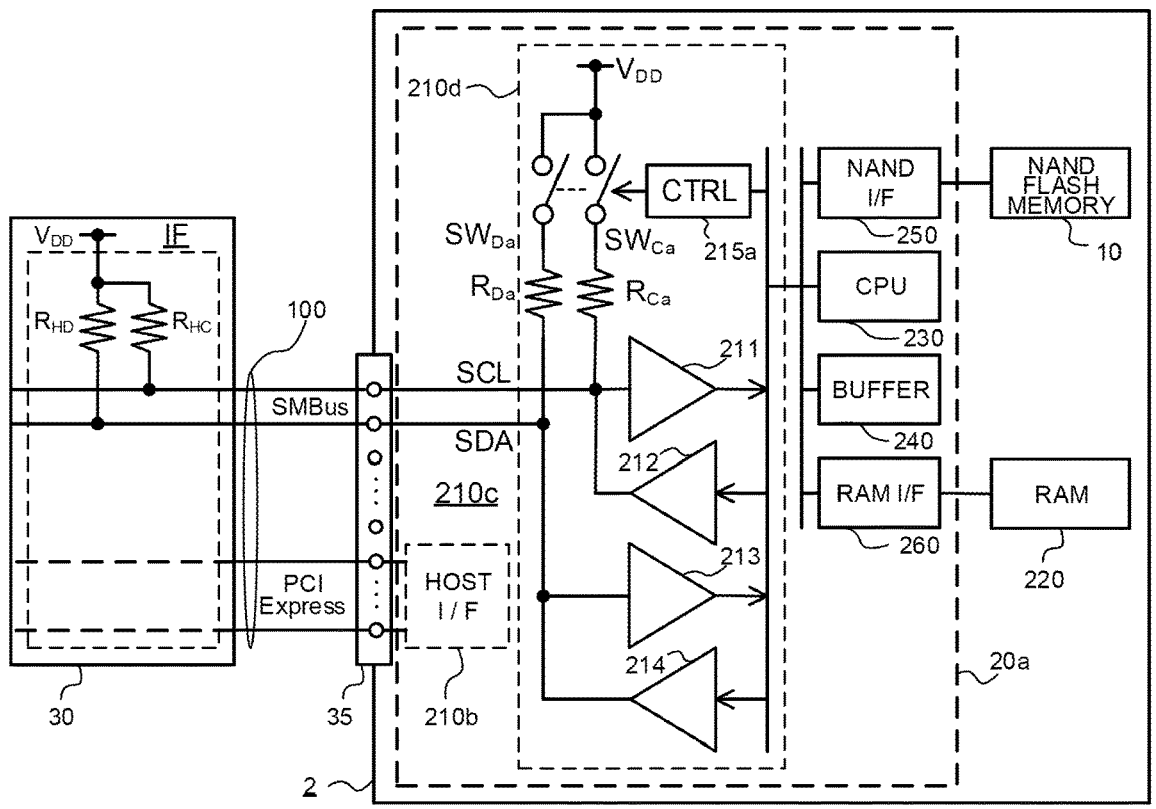
FIG. 7 is a block diagram illustrating a configuration in a state in which the host interface of the memory system according to the second embodiment is connected to the host device.

As illustrated in FIG. 6 and FIG. 7, the memory system 2 according to the second embodiment includes a controller 20a, and the controller 20a includes a host interface 210c. The host interface 210c has a host interface 210d conforming to the SMBus standard for low-speed communication and a host interface 210b conforming to the PCIe standard for high-speed communication.

The host interface 210d has an input buffer 211 which receives a clock signal from the SCL line and an input buffer 213 which receives a data signal from the SDA line. The input buffer 211 sends the received clock signal to another functional element of the controller 20a. The input buffer 213 sends the received data signal to another functional element of the controller 20a. The host interface 210d further has an output buffer 212 which sends a clock signal received from another functional element of the controller 20a, to the host device 30 through the SCL line. Similarly, the host interface 210d has an output buffer 214 which sends a data signal received from another functional element of the controller 20a, to the host device 30 through the SDA line.

The host interface 210d further has a resistor $R_{Ca}$, a resistor $R_{Da}$, a switch $SW_{Ca}$, and a switch $SW_{Da}$. The switch $SW_{Ca}$ has one end connected to a power supply line $V_{DD}$ and the other end connected to the resistor $R_{Ca}$. The resistor $R_{Ca}$ is disposed between the SCL line connected to an input/output port 35 and the switch $SW_{Ca}$. The switch $SW_{Da}$ has one end connected to the power supply line $V_{DD}$ and the other end connected to the resistor $R_{Da}$. The resistor $R_{Da}$ is disposed between the SDA line connected to the input/output port 35 and the switch $SW_{Da}$. The switch $SW_{Ca}$ and the switch $SW_{Da}$ are each constituted by, for example, an electronic switch or a transistor, and their opening/closing is controlled by a switch control circuit 215a. The resistor $R_{Ca}$ and the resistor $R_{Da}$ are one example of a resistance element. The switch $SW_{Ca}$ and the switch $SW_{Da}$ are one example of a switching element.

The SCL line connected to the input/output port 35 is connected to an input of the input buffer 211, an output of the output buffer 212, and one end of the resistor $R_{Ca}$. The other end of the resistor $R_{Ca}$ is connected to the power supply line $V_{DD}$ through the switch $SW_{Ca}$. An output of the input buffer 211 and an input of the output buffer 212 are connected to other functional elements of the controller 20a.

The SDA line connected to the input/output port 35 is connected to an input of the input buffer 213, an output of the output buffer 214, and one end of the resistor $R_{Da}$. The other end of the resistor $R_{Da}$ is connected to the power supply line $V_{DD}$ through the switch $SW_{Da}$. An output of the input buffer 213 and an input of the output buffer 214 are connected to the other functional elements of the controller 20a.

The switch control circuit 215a opens/closes the switch $SW_{Ca}$ and the switch $SW_{Da}$ based on an opening/closing condition. The opening/closing condition is based on whether or not the communication between the host device 30 and the memory system 2 has started. More specifically, the switch control circuit 215a opens the switch $SW_{Ca}$ and the switch $SW_{Da}$ when detecting, in the state in which the switch $SW_{Ca}$ and the switch $SW_{Da}$ are closed, that the transmission of a clock signal or a data signal from the SCL line or the SDA line has started, and otherwise, it keeps the switch $SW_{Ca}$ and the switch $SW_{Da}$ closed.

Specifically, first, the switch control circuit 215a closes the switch $SW_{Ca}$ and the switch $SW_{Da}$ to pull up the SCL line and the SDA line to the power supply line $V_{DD}$ through the resistor $R_{Ca}$ and the resistor $R_{Da}$, respectively. In this state, the switch control circuit 215a detects that the SLC line and the SDA line may be floating without the host device 30 connected to the input/output port 35 of the memory system 2. In this case, the switch control circuit 215a keeps the switch $SW_{Ca}$ and the switch $SW_{Da}$ closed to keep the SCL line and the SDA line pulled up to the power supply line $V_{DD}$ in the memory system 2 through the resistor $R_{Ca}$ and the resistor $R_{Da}$, respectively. On the other hand, when detecting that the host device 30 is connected to the input/output port 35 of the memory system 2 and the transmission of a clock signal or a data signal from the SCL line or the SDA line has started, the switch control circuit 215a opens the switch $SW_{Ca}$ and the switch $SW_{Da}$ to cancel the state in which the SCL line and the SDA line are pulled up in the memory system 2.

FIG. 7 illustrates a state in which the host device 30 is connected to the memory system 2 through the input/output port 35 in the second embodiment. As illustrated in FIG. 7, in the host device 30, the SCL line and the SDA line are pulled up to the power supply line $V_{DD}$ through the resistor $R_{HC}$ and the resistor $R_{HD}$ respectively in the interface IF.

When detecting that the SCL line or the SDA line starts transferring a clock signal or a data signal, the switch control circuit 215a opens the switch $SW_{Ca}$ and the switch $SW_{Da}$. This disconnects the resistor $R_{Ca}$ and the resistor $R_{Da}$ of the SCL line and the SDA line in the memory system 2 from the power supply line $V_{DD}$, resulting in that the SCL line and the SDA line are pulled up only to the power supply line $V_{DD}$ of the host device 30.

(Detection of Signal Transmission Start)

As illustrated in FIG. 7, in the host device 30, the SCL line and the SDA line are pulled up to the power supply line $V_{DD}$ to be stable. When the host device 30 is connected to the memory system 2, the SCL line and the SDA line having no signal are fixed to the potential of the power supply line $V_{DD}$. That the SCL line and the SDA line have no signal means that the host device 30 has not started the transmission of a clock signal or a data signal to the SCL line or the SDA line. On the other hand, when the host device 30 starts the transmission of a clock signal or a data signal to the SCL line or the SDA line, the potential of the SCL line or the SDA line becomes "L" level.

Figure 8:
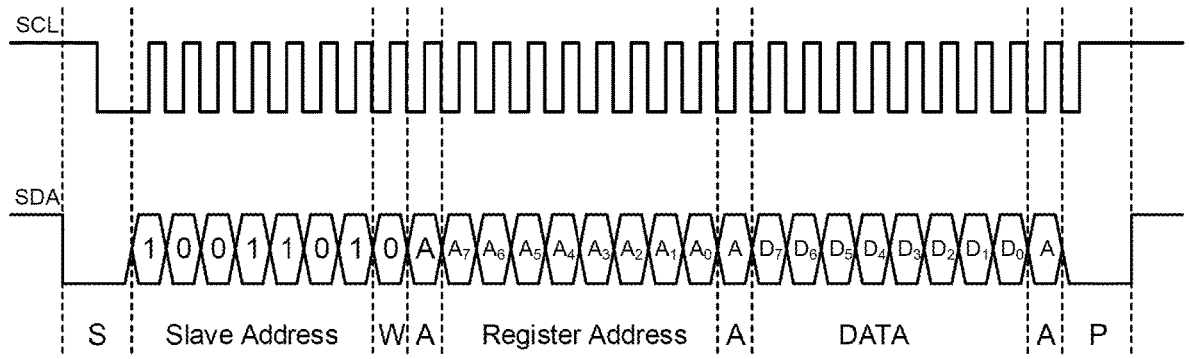
FIG. 8 is a diagram illustrating an example of a data format of a serial bus in the memory system according to the embodiments.

FIG. 8 illustrates a data waveform conforming to the SMBus standard in the embodiment. As illustrated in FIG. 8, in a waveform of data transferred according to this standard (a data signal flowing on the SDA line based on a clock signal flowing on the SCL line), a data array including a seven-bit Slave address, one-bit command(W), and one-bit ACK (A), a data array including an eight-bit register address and one-bit ACK (A), and a data array including an eight-bit data and one-bit ACK (A) are arranged in the order mentioned. These data arrays start with a change from an "H" level to an "L" level of the SCL line and the SDA line at Start S and end with a change from the "L" level to the "H" level of the SCL line and the SDA line at Stop P. The switch control circuit 215a according to the second embodiment detects the aforesaid change from the "H" level to the "L" level of the SCL line or the SDA line at Start S.

Here, the "H" level (or potential) indicates a logical value "H" and typically means, but is not limited to, the potential of the power supply line $V_{DD}$, and the "L" level (or potential) indicates a logical value "L" and typically means, but is not limited to, a potential of a ground line. For example, the "H" level may be a potential corresponding to the potential of the power supply line $V_{DD}$. The "L" level may be a potential corresponding to the potential of a ground line. The potential of the ground line may be a potential of a negative power supply line. Specifically, the "H" level may be 70% to 100% of the potential of the power supply line $V_{DD}$ and the "L" level may be 30% to 0% of the potential of the power supply line $V_{DD}$ (may be a ground potential or a potential of a negative power supply line).

To summarize, the memory system 2 according to the second embodiment detects the potential change from the "H" level to the "L" level appearing immediately before the transmission of a data array of a clock signal or a data signal flowing on the SCL line or the SDA line, to open the switch $SW_{Ca}$ and the $SW_{Da}$. Therefore, at the time of the transmission of the clock signal or the data signal, the SCL line and the SDA line are pulled up only in the host device 30, enabling stable signal transmission.

As illustrated in FIG. 8, at the start of the data transmission, the potential change from the "H" level to the "L" level on the SDA line precedes in time the potential change from the "H" level to the "L" level on the SCL line. Therefore, the switch control circuit 215a preferably detects the potential change from the "H" level to the "L" level appearing on the SDA line.

In the memory system 2 according to the second embodiment, by detecting the potential change from the "H" level to the "L" level appearing on the SCL line or the SDA line, it is detected that the host device 30 has started the transmission in the optional low-speed communication (for example, SMBus). This enables the detection of whether or not the host device 30 is connected, without providing a special additional function to the interface standard.

Operation of Second Embodiment

Next, the operation of the memory system 2 of this embodiment will be described with reference to FIG. 9. Since the memory system 2 according to the second embodiment is a modification of the memory system 1 according to the first embodiment, the same operations are denoted by the same reference signs, and a redundant description thereof will be omitted.

In an initial state in which the host device 30 is not connected to the input/output port 35, the switch control circuit 215a keeps the switch $SW_{Ca}$ and the switch $SW_{Da}$ closed (S500). In this state, which is the state illustrated in FIG. 6, the SCL line and the SDA line of the host interface 210d are pulled up to the power supply line $V_{DD}$ through the resistor $R_{Ca}$ and the resistor $R_{Da}$ in the host interface 210d (S515). This connects both the inputs of the input buffers 211 and 213 and the outputs of the output buffers 212 and 214 to the power supply line $V_{DD}$ to protect elements of the host interface 210d.

The switch control circuit 215a of the host interface 210d monitors the potentials of input signals on the SCL line and the SDA line through the input buffers 211 and 213 (S520). If neither the SCL line nor the SDA line changes in level, the monitoring is continued (No at S535). At this moment, the host device 30 has been connected to the memory system 2 through the input/output port 35, but the communication through the SCL line or the SDA line has not started yet.

When detecting the potential change of a clock signal or a data signal from "H" to "L" on the SCL line or the SDA line (Yes at S535), the switch control circuit 215a opens the switch $SW_{Ca}$ and the switch $SW_{Da}$ (S540). As a result, the state in which the SCL line and the SDA line are pulled up through the resistor $R_{Ca}$ and the resistor $R_{Da}$ is canceled. That the potential change from "H" to "L" is detected on the SCL line or the SDA line means that the SCL line or the SDA line is pulled up to the power supply line $V_{DD}$ through the resistor $R_{HC}$ or the resistor $R_{HD}$ in the host device 30 (and as a result, the transmission of data or the like is started), leading to the detection that the host device 30 has started the transmission in the optional low-speed communication (for example, SMBus) (S550).

The switch control circuit 215a of the host interface 210d monitors the potentials of the input signals on the SCL line and the SDA line through the input buffers 211 and 213 (S560). Specifically, the switch control circuit 215a monitors the potentials of the input signals regarding Stop P indicating that the transmission in the low-speed communication has completed. If there is no change in the potentials of the input signals within a particular time period, the monitoring is continued (No at S570). When detecting the potential change from the "L" level of specific length of time to the "H" level within the particular time period on the SCL line and the SDA line at Stop P after the completion of the transmission in the low-speed communication (Yes at S570), the switch control circuit 215a closes the switch $SW_{Ca}$ and the switch $SW_{Da}$ (S580). As a result of this operation, the SCL line and the SDA line of the host interface 210d are pulled up to the power supply line $V_{DD}$ through the resistor $R_{Ca}$ and the resistor $R_{Da}$ in the host interface 210d (S590). Accordingly, both the inputs of the input buffers 211 and 213 and the outputs of the output buffers 212 and 214 are connected to the power supply line $V_{DD}$ again. This protects the elements of the host interface 210d.

The above series of operations makes the data signal line (SDA line) and the clock signal line (SCL line) which are interface lines connecting the host device 30 and the memory system 2 constantly pulled up to the power supply line $V_{DD}$, to stabilize the operation of the circuit and protect the circuit.

In the memory system 2 according to the second embodiment, when the host device 30 is connected to the input/output port 35 and there is no data transmission on the SCL line and the SDA line, the SCL line and the SDA line have also been pulled up in the memory system 2. That is, they are pulled up both in the host device 30 and the memory system 2. However, this does not affect the protection of the elements included in the host interface 210d in view of that the potentials of the SCL line and the SDA line are stable. Further, since the pulling up in the memory system 2 is canceled at and after the start of the data transmission, there occurs no problem in the data transmission either. The significance of the switches is the same as that in the memory system 1 according to the first embodiment.

According to the memory system 2 according to the second embodiment, when the host device 30 starts the data transmission in the optional low-speed communication (for, example, SMBus), the state in which the data signal line and the clock signal line are pulled up in the memory system 2 is canceled. That is, they are pulled up to the power supply line $V_{DD}$ only through the resistor $R_{HC}$ and the resistor $R_{HD}$ provided in the host device 30. On the other hand, when the data transmission from the host device 30 to the memory system 2 ends, the data signal line and the clock signal line are pulled up in the host device 30 and the memory system 2. This series of operations enables the protection of the elements included in the host interface 210d.

Figure 9:
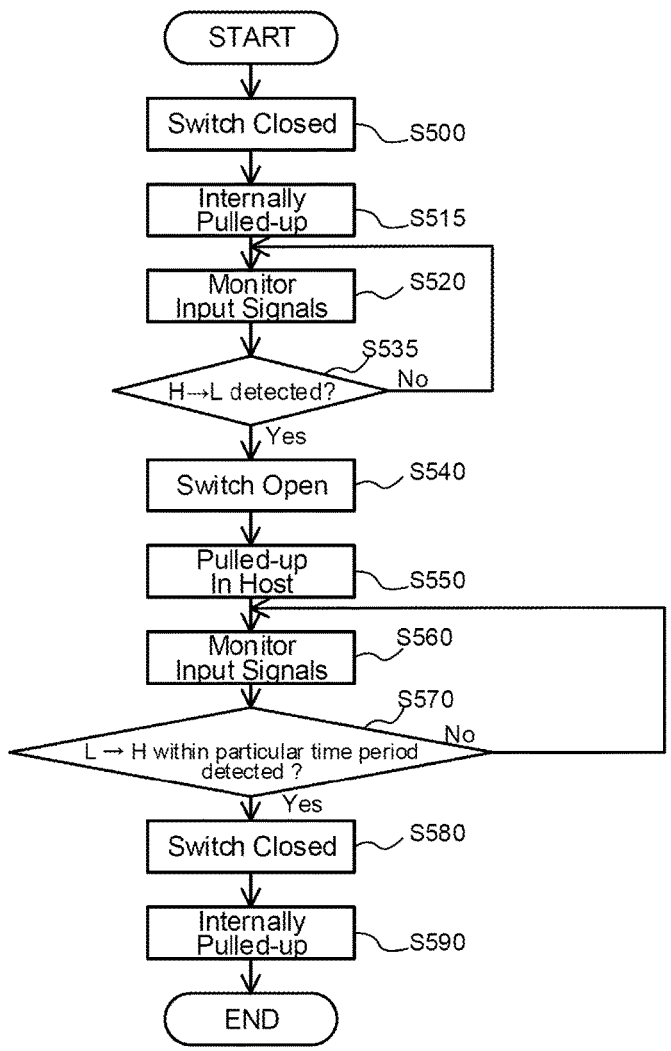
FIG. 9 is a flowchart illustrating an operation of the host interface in the memory system according to the second embodiment.

The processes after (S560) in FIG. 9 may not be executed. That is, as illustrated in FIG. 9, the switch control circuit 215a opens the switch $SW_{Ca}$ and the switch $SW_{Da}$ (S540), and it is detected that the host device 30 has started the transmission in the optional low-speed communication (for example, SMBus) (S550). After (S550), the switch $SW_{Ca}$ and the switch $SW_{Da}$ may be maintained to be opened, even if the optional low-speed communication has been completed. The opening of the switch $SW_{Ca}$ and the switch $SW_{Da}$ will be maintained while a period of time of the host device 30 being connected to the memory system 2. This period of time corresponds to a period of time of the memory system 2 being supplied power from outside (e.g. from the host device 30). Once the host device 30 has been connected to the memory system 2, the SCL line and the SDA line are maintained to be pulled up to the power supply line $V_{DD}$ through the resistor $R_{HC}$ or the resistor $R_{HD}$ in the host device 30. As a result, the elements of the host interface 210d are protected.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system connectable to a host, the memory system comprising a nonvolatile memory and a memory controller,
wherein the memory controller is capable of executing a command received from the host and addressed to the memory, and
wherein the memory controller comprises:
a signal line capable of transferring a signal sent from the host;
a resistance element disposed between and electrically connected to the signal line and a wiring line given a reference potential of the memory system;
a switching element connected serially to the resistance element and capable of switching a connection between the signal line and the wiring line; and
a control circuit capable of controlling the switching element to switch the connection between the signal line and the wiring line from a connected state to a disconnected state, on a basis of a change of a potential of the signal line from a first potential corresponding to a logical value H level to a second potential corresponding to a logical value L level or a change of the potential of the signal line from the second potential to the first potential.

2. The memory system according to claim 1,
wherein the reference potential is a ground potential of the memory system, and
wherein the control circuit is capable of controlling the switching element to switch the connection between the signal line and the wiring line from the connected state to the disconnected state on the basis of the change from the second potential to the first potential on the signal line.

3. The memory system according to claim 1,
wherein the reference potential is a positive power supply potential of the memory system, and
wherein the control circuit is capable of controlling the switching element to switch the connection between the signal line and the wiring line from the connected state to the disconnected state on the basis of the change from the first potential to the second potential on the signal line.

4. The memory system according to claim 1,
wherein the signal line includes a clock signal line capable of transferring a clock signal and a data signal line capable of transferring a data signal, and
wherein the control circuit is capable of controlling the switching element to switch connection between the clock signal line and the wiring line and to switch connection between the data signal line and the wiring line from a connected state to a disconnected state respectively, on the basis of a change from the first potential to the second potential on the clock signal line or the data signal line.

5. The memory system according to claim 1, wherein the signal line is electrically connected to a host wiring line given a reference potential of the host, through a host resistance element.

6. The memory system according to claim 1, the memory system conforming to the SMBus™ standard.

7. The memory system according to claim 1, the memory system conforming to a plurality of different interface standards.

8. The memory system according to claim 7, wherein the plurality of interface standards include the SMBus™ standard and the PCIe™ standard.

9. A method of controlling a memory system connectable to a host, the memory system including a nonvolatile memory, the memory system being capable of executing a command received from the host and addressed to the memory, the memory system including: a signal line transferrable a signal sent from the host; and a resistance element disposed between and electrically connected to the signal line and a wiring line given a reference potential of the memory system,
the method comprising
controlling a connection state between the signal line and the wiring line, on a basis of a change of a potential of the signal line from a first potential corresponding to a logical value H level to a second potential corresponding to a logical value L level or a change of the potential of the signal line from the second potential to the first potential.

10. The method according to claim 9, further comprising switching the connection state between the signal line and the wiring line from a connected state through the resistance element to a disconnected state.

11. The method according to claim 10,
wherein the reference potential is a ground potential of the memory system, and
the method further comprising:
switching the connection state between the signal line and the wiring line from the connected state to the disconnected state on the basis of the change from the second potential to the first potential on the signal line.

12. The method according to claim 10,
wherein the reference potential is a positive power supply potential of the memory system, and
the method further comprising:
switching the connection state between the signal line and the wiring line from the connected state to the disconnected state on the basis of the change from the first potential to the second potential on the signal line.

13. The method according to claim 10,
wherein the signal line includes a clock signal line capable of transferring a clock signal and a data signal line capable of transferring a data signal, and
the method further comprising:
switching connection state between the clock signal line and the wiring line and switching connection state between the data signal line and the wiring line from a connected state to a disconnected state respectively, on the basis of a change from the first potential to the second potential on the clock signal line or the data signal line.

14. The method according to claim 9, wherein the signal line is electrically connected to a host wiring line given a reference potential of the host, through a host resistance element.

15. The method according to claim 9, the memory system conforming to the SMBus™ standard.

16. The method according to claim 9, the memory system conforming to a plurality of different interface standards.

17. The method according to claim 16, wherein the plurality of interface standards include the SMBus™ standard and the PCIe™ standard.

18. A memory system including a nonvolatile memory, the memory system comprising:
a connector portion connectable to a host; and a memory controller capable of executing a command received from the host through the connector portion and addressed to the memory, wherein the memory controller comprises:

a signal line capable of transferring a signal sent from the host through the connector portion;

a resistance element disposed between and electrically connected to the signal line and a wiring line given a reference potential of the memory system;

a switching element connected serially to the resistance element and capable of switching a connection between the signal line and the wiring line given the reference potential; and a control circuit capable of controlling the switching element to disconnect the connection on a basis of a change of a state of a potential of the signal line.

19. The memory system according to claim 18, wherein the reference potential is a ground potential of the memory system, and wherein the control circuit is capable of controlling the switching element to open the switching element on the basis of a potential corresponding to a logical value H level on the signal line.

20. The memory system according to claim 18, wherein the reference potential is a potential of a positive power supply voltage of the memory system, and wherein the control circuit is capable of controlling the switching element to open the switching element on the basis of a change from a potential corresponding to a logical value H level to a potential corresponding to a logical value L level on the signal line.

* * * * *